United States Patent
Toyoda

(10) Patent No.: US 10,825,877 B2
(45) Date of Patent: Nov. 3, 2020

(54) ELECTROLUMINESCENCE DISPLAY DEVICE AND MANUFACTURING METHOD THEREOF

(71) Applicant: Japan Display Inc., Minato-ku (JP)

(72) Inventor: Hironori Toyoda, Minato-ku (JP)

(73) Assignee: Japan Display Inc., Minato-ku (JP)

( * ) Notice: Subject to any disclaimer, the term of this patent is extended or adjusted under 35 U.S.C. 154(b) by 0 days.

(21) Appl. No.: 16/783,297

(22) Filed: Feb. 6, 2020

(65) Prior Publication Data
US 2020/0258961 A1   Aug. 13, 2020

(30) Foreign Application Priority Data
Feb. 13, 2019   (JP) .................................. 2019-023351

(51) Int. Cl.
*H01L 27/32* (2006.01)
*H01L 51/50* (2006.01)
*H01L 51/56* (2006.01)

(52) U.S. Cl.
CPC ...... *H01L 27/3246* (2013.01); *H01L 51/5012* (2013.01); *H01L 51/56* (2013.01); *H01L 2227/323* (2013.01); *H01L 2251/5315* (2013.01)

(58) Field of Classification Search
CPC . H01L 27/3246; H01L 51/5012; H01L 51/56; H01L 2227/323; H01L 2251/5315
USPC .............................................................. 257/40
See application file for complete search history.

(56) References Cited

U.S. PATENT DOCUMENTS

2017/0162638 A1* 6/2017 Nendai ................... H01L 51/56

FOREIGN PATENT DOCUMENTS

JP    2016-157799 A   9/2016

* cited by examiner

*Primary Examiner* — Tong-Ho Kim
(74) *Attorney, Agent, or Firm* — Oblon, McClelland, Maier & Neustadt, L.L.P.

(57) ABSTRACT

Provided is an electroluminescence display device including, on a substrate, a plurality of pixels having a light emitting layer made of an electroluminescent material obtained by adding a dopant to a host material, and a bank that separates the adjacent pixels and has been subjected to bleaching processing, in which within the plane of the substrate, the concentration of the dopant in the light emitting layer is distributed and the intensity of the bleaching processing performed on the bank is distributed.

4 Claims, 9 Drawing Sheets

ELECTROLUMINESCENCE DISPLAY DEVICE AND MANUFACTURING METHOD THEREOF

CROSS-REFERENCE TO RELATED APPLICATION

The present application claims priority from Japanese patent application JP 2019-023351 filed on Feb. 13, 2019, the content of which is hereby incorporated by reference into this application.

BACKGROUND OF THE INVENTION

1. Field of the Invention

The present invention relates to an electroluminescence display device and a manufacturing method thereof.

2. Description of the Related Art

JP 2016-157799 A describes an EL display device including an EL element having alight emitting layer including a host (main material) and at least two types of dopants (sub-materials), in which the at least two types of dopants have different concentration distributions with respect to the host respectively. JP 2016-157799 A also describes that when the concentration distribution of the dopant added to the light emitting layer changes, the lifetime and the light emission efficiency as the light emitting layer are affected.

In an electroluminescence display device, since a material used for a light emitting layer is highly sensitive to moisture, oxygen, and the like in atmosphere and easily deteriorates, vacuum deposition is often used for forming a light emitting layer. However, in vacuum deposition, when the size of a target substrate increases, it is difficult to form a film uniformly in a plane, and non-uniformity occurs.

As the material of the light emitting layer, a material added with a dopant for realizing a desired light emission color with respect to a host as a main material is used. Here, the applicants have experimentally found that the concentration of the dopant has a great influence on the lifetime of the electroluminescence element. In other words, the higher the dopant concentration is, the shorter the lifetime of the electroluminescence element is, and the more likely the deterioration over time of use proceeds.

If the dopant concentration is uniform in the plane of the electroluminescence display device, all the electroluminescence elements constituting the display device will be uniformly deteriorated, and although the brightness and contrast are reduced as a whole, there is not much problem in practical use. However, since the dopant concentration is non-uniform as described above, the degree of progress of deterioration in the plane of the electroluminescence display device varies with use. This deterioration is visually recognized as unevenness in brightness and contrast in the plane and is recognized as so-called burn-in, which may impede practical use at an early stage.

SUMMARY OF THE INVENTION

The present invention has been made in light of such circumstances, and an object of the present invention is to alleviate the in-plane difference in the degree of progress of deterioration over time with the use of electroluminescence elements in an electroluminescence display device.

The invention disclosed in the present application in order to solve the above problems has various aspects, and the outline of typical ones of these aspects is as follows.

(1) An electroluminescence display device including a plurality of pixels that include, on a substrate, a light emitting layer made of an electroluminescent material in which a dopant is added to a host material, and a bank that separates the adjacent pixels and has been subjected to bleaching processing, in which within the plane of the substrate, the concentration of the dopant in the light emitting layer is distributed, and the intensity of the bleaching processing performed on the bank is distributed.

(2) The electroluminescence display device according to (1), in which the concentration distribution of the dopant has a correlation with the intensity distribution of the bleaching processing.

(3) The electroluminescence display device according to (2), in which the correlation between the concentration distribution of the dopant and the intensity distribution of the bleaching processing is a positive correlation.

(4) An electroluminescence display device including a plurality of pixels that includes, on a substrate, alight emitting layer made of an electroluminescent material in which a dopant is added to a host material, and a bank that separates the adjacent pixels, in which within the plane of the substrate, the concentration of the dopant in the light emitting layer is distributed, and the concentration of a photoresist material or a photoresist material-derived substance remaining inside or on the surface of the bank is distributed.

(5) The electroluminescence display device according to (4), in which the concentration distribution of the dopant has a correlation with the concentration distribution of the photoresist material or the photoresist material-derived substance remaining inside or on the surface of the bank.

(6) The electroluminescence display device according to (5), in which the correlation between the concentration distribution of the dopant and the concentration distribution of the photoresist material or the photoresist material-derived substance remaining inside or on the surface of the bank is a negative correlation.

(7) A manufacturing method of an electroluminescence display device including a step of forming a bank separating pixels on a substrate by photolithography, a step of forming a light emitting layer made of an electroluminescent material in which a dopant is added to a host material on the substrate by vapor deposition, and a step of non-uniformly bleaching the inside of the plane of the bank according to the in-plane distribution of the dopant concentration of the light emitting layer or the in-plane distribution of the degree of deterioration over time of the light emitting layer.

(8) The manufacturing method of an electroluminescence display device according to (7), including a step of measuring the in-plane distribution of the dopant concentration of the light emitting layer or the in-plane distribution of the degree of deterioration over time of the light emitting layer.

DETAILED DESCRIPTION OF THE INVENTION

An electroluminescence display device 100 according to the embodiment of the present invention is characterized by the manufacturing process thereof and the distribution of material properties generated by the manufacturing process. Therefore, first, a typical structure of the electroluminescence display device 100 according to the embodiment and a manufacturing method thereof will be described below.

Figure 1:
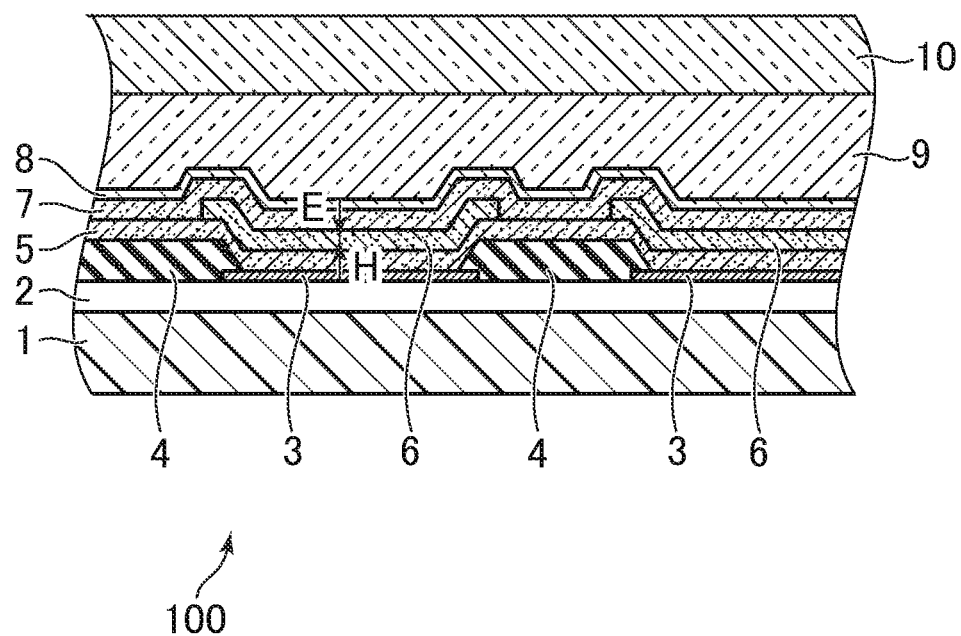
FIG. 1 is a partial cross-sectional schematic diagram illustrating a typical structure of a top emission type electroluminescence display device.

FIG. 1 is a partial cross-sectional schematic diagram illustrating a typical structure of the top emission type electroluminescence display device 100. In addition, here, although the top emission type is illustrated as the electroluminescence display device 100, a bottom emission type or other types may be employed.

The electroluminescence display device 100 has a structure in which a substrate 1, a circuit layer 2 formed on the substrate 1, a pixel electrode 3 formed for each pixel, a bank 4 separating the pixels, a positive charge transport layer 5 formed over the pixel electrode 3 and the bank 4, a light emitting layer 6 formed independently for each pixel, a negative charge transport layer 7 covering the light emitting layer 6, a common electrode 8, a sealing layer 9, and a sealing substrate 10 are laminated in this order. The sealing substrate 10 may not be formed, or may be a functional layer such as a touch sensor.

The substrate 1 is an insulating substrate, and the material thereof is not particularly limited. Typically, glass is used, but ceramics or other resin substrates may be used. Further, the substrate 1 may be a rigid substrate, a soft and flexible material, and may or may not have transparency to light.

The circuit layer 2 is a layer in which an electronic circuit for individually supplying and blocking electric charges with respect to the pixel electrode 3 of each pixel of the electroluminescence display device 100 is formed. The circuit layer 2 includes a plurality of insulating layers, wirings, thin film transistors, and the like. As the structure itself of the circuit layer 2, various structures are well known, and details thereof have no technically important relationship with the gist of the present invention, and are therefore omitted in this specification.

The pixel electrode 3 is an electrode that receives a supply of electric charges from the circuit layer and transmits the electric charges to electroluminescence elements constituting the pixel. The material and structure of the pixel electrode 3 are not particularly limited. In the present embodiment, the pixel electrode 3 has a three-layer structure in which a metal layer made of silver, aluminum, a silver/magnesium alloy, or the like is laminated on an indium tin oxide (ITO) layer and further an ITO layer is laminated thereon. In this embodiment, the pixel electrode 3 is designed to be supplied with a positive charge. However, this design can be reversed to supply a negative charge. In that case, the arrangement of the positive charge transport layer 5 and the negative charge transport layer 7 described later is reversed.

The bank 4 is also referred to as a pixel separation film or a pixel separation layer, and is an insulating layer that separates the pixels, and has a lattice-like planar shape. As shown in FIG. 1, in the cross section, the bank 4 is arranged between the adjacent pixel electrodes 3 so that both ends thereof overlap with the circumferential edge of the pixel electrode 3, and the end portion thereof may be a taper-shaped inclined surface. The material of the bank 4 may be an inorganic material such as SiO, SiN or SiON, or an appropriate resin.

The positive charge transport layer 5 is a layer that transports positive charges supplied to the pixel electrode 3 to the light emitting layer 6, and here, positive charge carriers are holes. The positive charge transport layer 5 is not necessarily a single layer, and is preferably formed by laminating a hole injection layer, a hole transport layer, and an electron block layer in this order from the pixel electrode 3 side. In FIG. 1, the positive charge transport layer 5 is shown to be provided in common for each pixel. However, the positive charge transport layer 5 may be formed so as to be separated independently for each pixel, or some of the plurality of layers constituting the positive charge transport layer 5 may be formed to be separated independently for each pixel. Since various configurations and materials are well known for the configuration of the positive charge transport layer 5 and the material of each layer constituting the positive charge transport layer 5, detailed descriptions thereof are omitted in this specification.

The light emitting layer 6 is a layer adjusted by adding various dopants to a host material so that light emission of a desired color occurs in the light emitting layer 6. Since the type and concentration of the dopant to be added differ depending on the color to be emitted, when the electroluminescence display device 100 has a different light emission color for each pixel, such as RGB or RGBY, different dopants for each light emission color of the pixel are added. When the electroluminescence display device 100 emits a single color, for example, white light, the material of the light emitting layer 6 may be the same in the plane of the electroluminescence display device 100. In this case, the light emitting layer 6 is not necessarily formed so as to be separated independently for each pixel as shown in FIG. 1, and may be formed in common over a plurality of pixels.

The negative charge transport layer 7 is a layer that transports negative charges from the common electrode 8 to the light emitting layer 6, and here, the negative charge carriers are electrons. The negative charge transport layer 7 is also not necessarily a single layer, and is preferably formed by laminating an electron injection layer, an electron transport layer, and a hole blocking layer in this order from the common electrode 8 side. In FIG. 1, the negative charge transport layer 7 is shown to be provided in common for each pixel. However, the negative charge transport layer 7 may be formed so as to be separated independently for each pixel, or some of the plurality of layers constituting the negative charge transport layer 7 may be formed to be separated independently for each pixel. Since various configurations and materials are well known for the configuration of the negative charge transport layer 7 and the material of each layer constituting the negative charge transport layer 7, detailed descriptions thereof are omitted in this specification.

The common electrode 8 is a transparent conductive thin film provided in common to each pixel, and is formed of a known transparent thin film electrode material such as ITO, indium zinc oxide (IZO) or indium gallium zinc oxide (IGZO). The common electrode 8 is connected to an external circuit and is maintained to be grounded or at a predetermined voltage.

The sealing layer 9 shields and protects the electroluminescence element including the positive charge transport layer 5, the light emitting layer 6, and the negative charge transport layer 7 from the outside, and is made of an appropriate transparent material. The transparent material may be an inorganic material such as SiO, SiN or SiON, a resin such as acrylic or epoxy, or a combination thereof.

The sealing substrate 10 is a transparent substrate, and glass or an appropriate transparent resin is used. When the electroluminescence display device 100 has flexibility as a whole, that is, when the substrate 1 has flexibility, the sealing substrate 10 may also be flexible. Further, when the light emitting layer 6 does not have a plurality of light emission colors individually, a color filter may be provided on the lower surface (surface on the sealing layer 9 side) of the sealing substrate 10 as necessary.

In the electroluminescence display device 100, when anyone of the pixels emits light, a predetermined positive voltage is applied to the pixel electrode 3 desired to emit light. Thus, as indicated by an arrow H in FIG. 1, holes move from the pixel electrode 3 to the light emitting layer 6 through the positive charge transport layer 5. At the same time, as indicated by an arrow E, electrons move from the common electrode 8 to the light emitting layer 6 through the negative charge transport layer 7, and the holes and the electrons combine in the light emitting layer 6 to emit light of a color corresponding to the material of the light emitting layer 6.

Then, the outline of the manufacturing method of the electroluminescence display device 100 will be described.

First, the circuit layer 2 is formed on the substrate 1. The circuit layer 2 is formed by repeating a general photolithography process a plurality of times, and various techniques are well known. Therefore, detailed descriptions thereof are omitted in this specification.

Subsequently, the pixel electrode 3 is formed on the circuit layer 2. This formation may also be a general photolithography method.

Further, the bank 4 is formed so as to divide the pixel electrode 3. Although the formation of the bank 4 is also based on a general photolithography technique, the details will be described in detail with reference to FIGS. 2A to 2E.

Figure 2A:
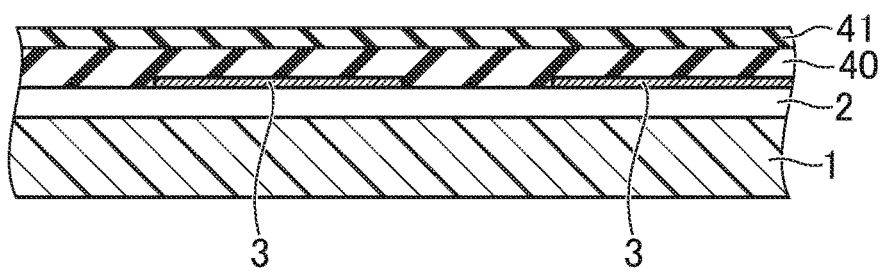
FIGS. 2A to 2E are diagrams illustrating a process for forming a bank.
Figure 2B:
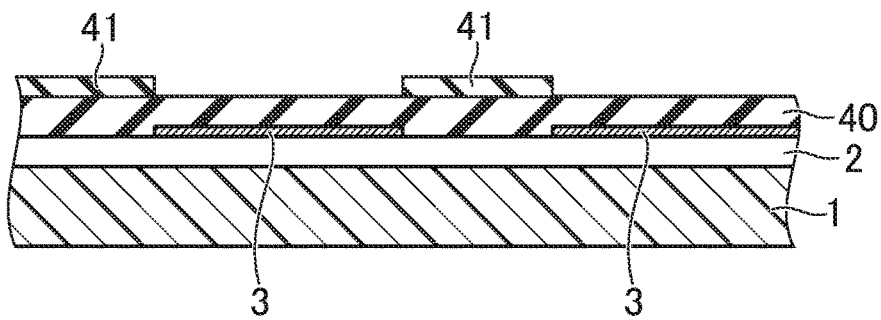
Figure 2C:
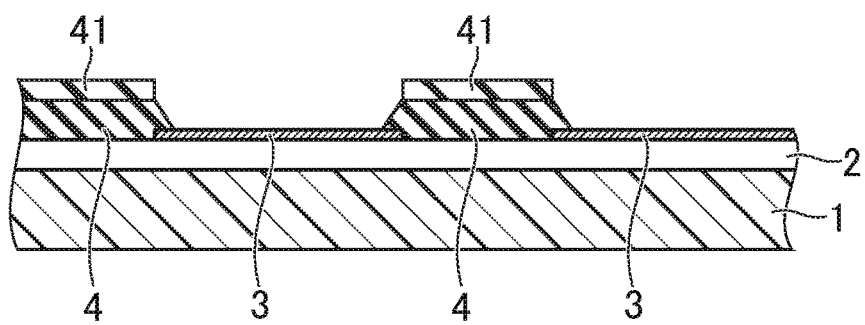
Figure 2D:
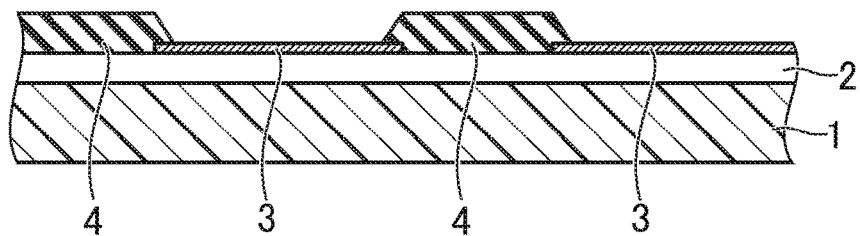

First, a bank material layer 40 as a material of the bank 4, and a photoresist layer 41 formed thereon are formed so as to extend over the circuit layer 2 and the pixel electrode 3 (FIG. 2A). The photoresist layer 41 is exposed in an appropriate pattern, and a mask pattern is formed by exfoliating a photosensitive portion or a non-photosensitive portion (FIG. 2B), and then the bank material layer 40 is etched to form the bank 4 (FIG. 2C). Then, the photoresist layer 41 is exfoliated (FIG. 2D).

In this state, a photoresist material remains on the surface of the bank 4 or inside thereof when the photoresist layer 41 is not completely exfoliated, or a part of the photoresist layer 41 enters the inside of the bank 4. The applicants have found that the residual concentration of the photoresist material or a photoresist material-derived substance remaining on the surface of the bank 4 or inside thereof has a negative correlation with the lifetime of the electroluminescence element. In other words, the higher the residual concentration of the photoresist material or the photoresist material-derived substance remaining on the surface of the bank 4 or inside thereof, the faster the progress of the deterioration over time of the electroluminescence element, and the shorter the lifetime.

Figure 2E:
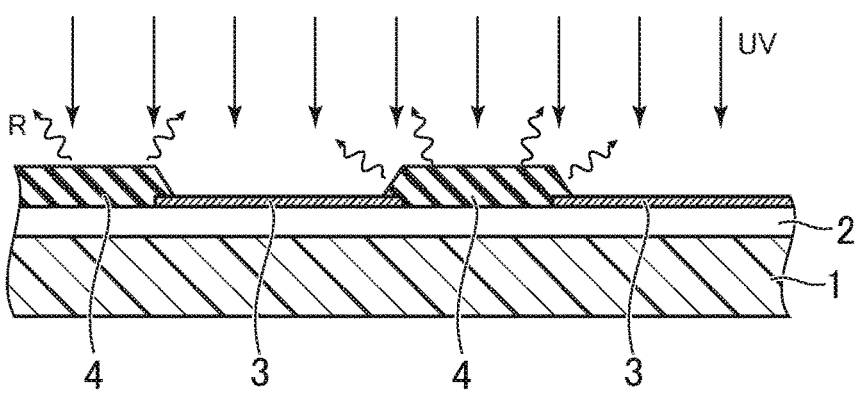

In order to suppress the deterioration over time of the electroluminescence element due to such a photoresist material or a photoresist material-derived substance, a process called bleaching is performed on the bank 4 (FIG. 2E). This bleaching is a process of decomposing the photoresist material or the photoresist material-derived substance and reducing the residual concentration thereof. In this embodiment, the bleaching is ultraviolet irradiation. In FIG. 2E, arrows indicated as UV indicate the ultraviolet ray irradiated, and wave arrows indicated as R indicate the photoresist material or the photoresist material-derived substance that is decomposed and dissipated.

Figure 3:
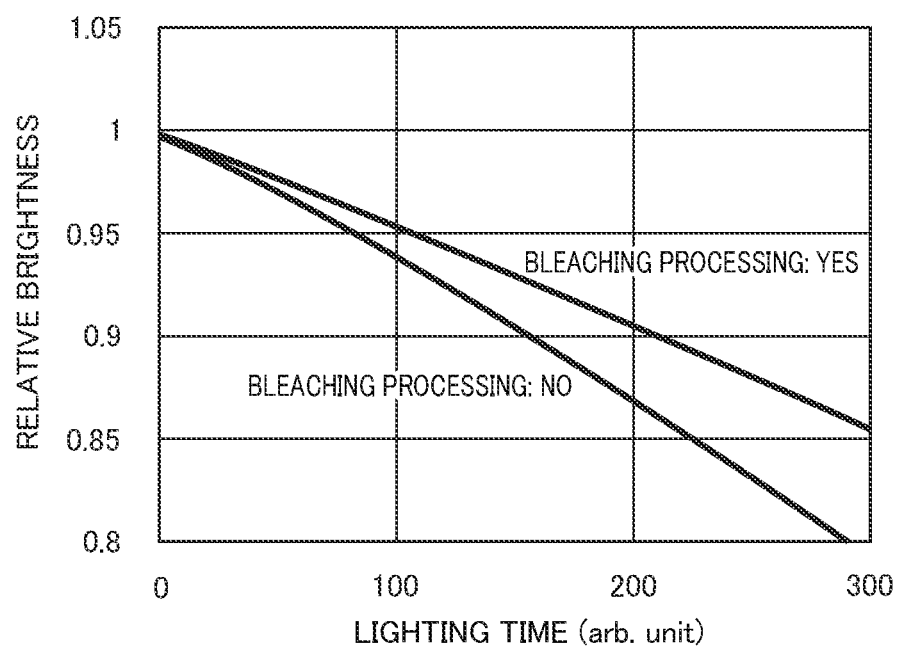
FIG. 3 is a graph showing measurement results of changes in brightness with respect to lighting time of a sample subjected to bleaching processing and a sample not subjected to bleaching processing.

FIG. 3 is a graph showing measurement results of changes in brightness with respect to lighting time of a sample subjected to bleaching processing and a sample not subjected to bleaching processing. In the graph, the horizontal axis represents the lighting time (arb. unit) of the produced electroluminescence element, and the vertical axis represents the relative brightness with the light emission brightness immediately after production as being 1. As is clear from the graph, the sample not subjected to the bleaching processing has a faster decrease in brightness and a shorter lifetime, and the sample subjected to the bleaching processing has a slower decrease in brightness and a longer lifetime.

In this specification, the lifetime of the electroluminescence element means the cumulative lighting time of the element until the brightness is reduced to a specific brightness with respect to the light emission brightness immediately after production. The brightness that determines the lifetime may be appropriately determined according to the application of the product, for example, may be determined as 70% of the light emission brightness immediately after production. In measuring the brightness when specifying the lifetime, a voltage value applied to the electroluminescence element is set to a constant value.

Referring back to FIG. 1, the positive charge transport layer 5, the light emitting layer 6, the negative charge transport layer 7, and the common electrode 8 are laminated in this order on the pixel electrode 3 and the bank 4. Each layer is formed by vapor deposition, and as the method of vapor deposition, any method including PVD such as sputtering or ion plating, or CVD may be appropriately used. Moreover, each layer may be patterned using a mask as necessary.

When forming the light emitting layer 6, preferably, a host material and two types of dopants as the source of the film-forming material are prepared, and then, a film is simultaneously formed or the dopants are deposited after the host material is filmed.

Finally, the electroluminescence display device 100 is obtained by forming the sealing layer 9, bonding the sealing substrate 10, and performing necessary wiring and the like.

Figure 4:
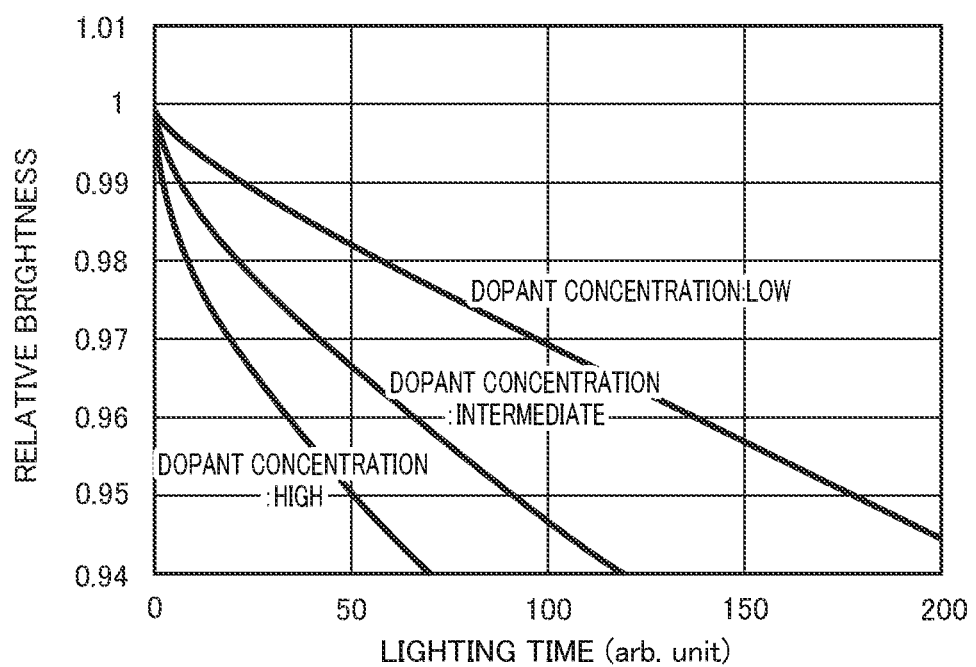
FIG. 4 is a graph showing measurement results of changes in brightness with respect to lighting time of samples having different dopant concentrations in a light emitting layer.

FIG. 4 is a graph showing measurement results of changes in brightness with respect to lighting time of samples with different dopant concentrations in the light emitting layer 6. In the graph, the horizontal axis represents the lighting time (arb. unit) of the produced electroluminescence element, and the vertical axis represents the relative brightness with the light emission brightness immediately after production as being 1. As is clear from the graph, the sample with a higher dopant concentration has a faster decrease in brightness and a shorter lifetime, and the sample with a lower dopant concentration has a slower decrease in brightness and a longer lifetime.

Of course, the dopant concentration in the light emitting layer 6 is not determined only in consideration of the lifetime of the electroluminescence element, but should be designed so as to obtain a color required as a light emission color. It is most preferable that ideally, the dopant concentration is uniformly distributed over the entire surface of the electroluminescence display device 100 as designed.

However, in the vapor deposition process, the larger the target substrate, the more difficult to form a uniform film over the entire surface of the substrate, resulting in unevenness unique to the manufacturing apparatus and lot. This means that the dopant concentration in the light emitting layer 6 is not uniform over the entire surface of the electroluminescence display device 100, and the lifetime of the electroluminescence element varies partially.

Figure 5:
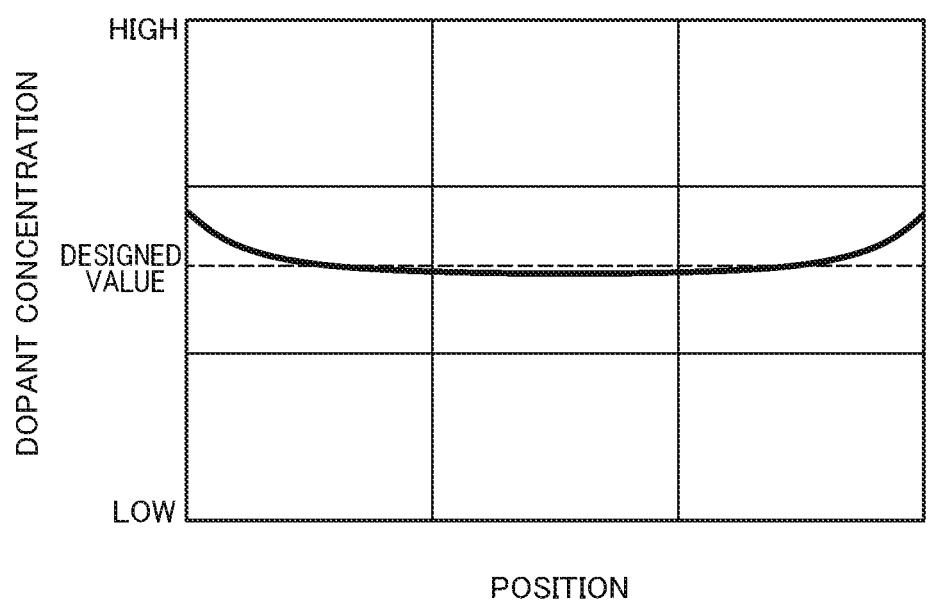
FIG. 5 is a graph showing an example of the distribution of the in-plane dopant concentration generated in the electroluminescence display device.

FIG. 5 is a graph showing an example of the distribution of the in-plane dopant concentration generated in the electroluminescence display device 100. The horizontal axis of the drawing represents the position in the short axis direction of the electroluminescence display device 100 having a rectangular shape as a whole, and the measurement position with respect to the long axis is approximately the center of the electroluminescence display device 100.

As is clear from the graph, the in-plane central portion of the electroluminescence display device 100 and the vicinity thereof have a substantially designed value or a slightly lower concentration than the designed value, compared to the designed value of the dopant concentration indicated by a dotted line. However, in the peripheral portion of the electroluminescence display device 100, the concentration is higher than the designed value. Therefore, in such an electroluminescence display device 100, unless special measures are taken, it is expected that the peripheral portion of the screen becomes darker than the central portion due to deterioration over time, and a uniform image display cannot be obtained.

Of course, the distribution of the dopant concentration shown here is an example, and the distribution of the dopant concentration varies depending on conditions such as a manufacturing apparatus, and a mask and material to be used, and a product lot. The dopant concentration in the peripheral portion of the electroluminescence display device 100 is not necessarily higher than the central portion. Such a dopant concentration can be obtained directly by measuring a produced sample or indirectly by performing a lighting test on a manufactured product and measuring the degree of deterioration over time (that is, change in brightness) as described later.

In this embodiment, each measurement point on the sample of the electroluminescence display device 100 formed up to the light emitting layer 6 is directly measured using a known technique such as energy dispersive X-ray diffraction (EDX), secondary ion mass spectrometry (SIMS), or gas chromatograph mass spectrometry (GCMS), and is calculated by converting the dopant concentration from the obtained element distribution. Alternatively, the sample of the completed electroluminescence display device 100 is continuously turned on, and the dopant concentration may be converted and obtained based on the relationship between the decrease in brightness and the dopant concentration shown in FIG. 4 from the degree of decrease in brightness at each measurement point. Although this technique is easy to measure, the sample needs to be continuously turned on until the electroluminescence element is deteriorated to a measurable level, and thus it takes time to obtain the measurement result.

Then, based on the obtained distribution of the dopant concentration, the intensity of bleaching shown in FIG. 2E is changed in the plane of the electroluminescence display device 100. That is, bleaching is performed non-uniformly within the plane so that the intensity distribution of the bleaching processing performed on the bank 4 has a correlation with the concentration distribution of the dopant of the light emitting layer 6. More specifically, the intensity of the bleaching processing is high for the portion where the dopant concentration of the light emitting layer 6 is high, and the intensity of the bleaching processing is low for the portion where the dopant concentration of the light emitting layer 6 is low. That is, the correlation between the concentration distribution of the dopant and the intensity distribution of the bleaching processing is set as a positive correlation.

The reason for this is that, considering the effect on the lifetime due to the photoresist material or the photoresist material-derived substance, the decomposition of the photoresist material or the photoresist material-derived substance is more likely in the region where the intensity of the bleaching processing is high and the lifetime of the electroluminescence element is increased, whereas the photoresist material or the photoresist material-derived substance remains in the region where the intensity of the bleaching processing is low and the lifetime of the electroluminescence element is short. Therefore, if this fact is used, the distribution of the influence on the lifetime of the electroluminescence element due to the intensity of the bleaching processing is made to be opposite to the distribution of the influence on the lifetime of the electroluminescence element due to the concentration distribution of the dopant, and thus, the non-uniformity of the lifetime of the electroluminescence element in the plane of the electroluminescence display device 100 can be reduced.

Figure 6:
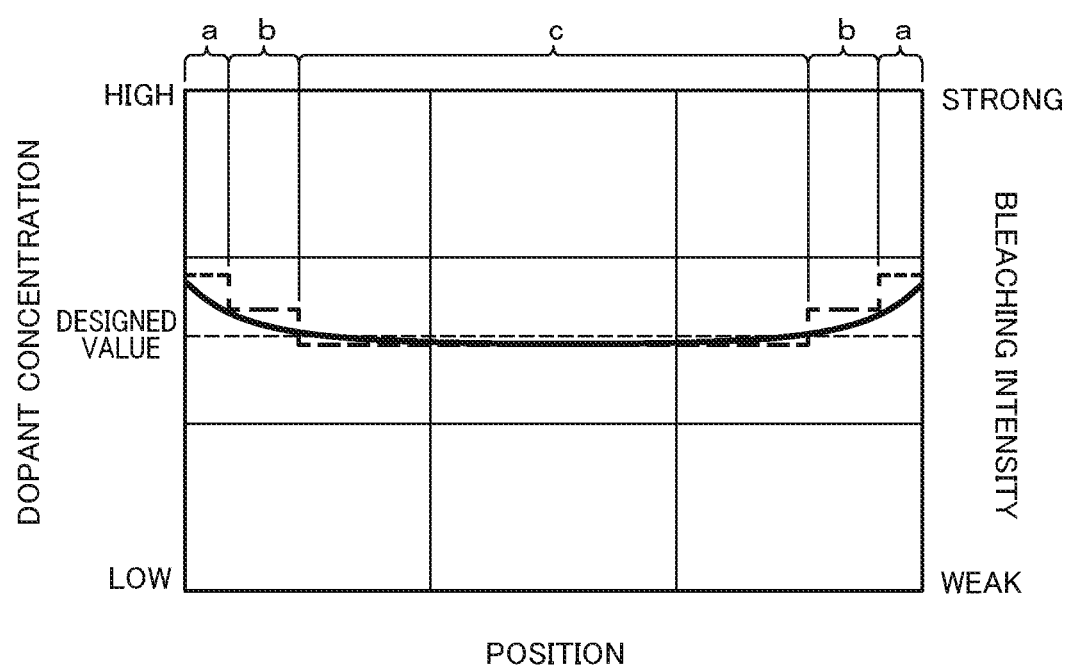
FIG. 6 is a graph showing the intensity distribution of the bleaching processing superimposed on the dopant concentration distribution shown in FIG. 5.

FIG. 6 is a graph in which the distribution of the intensity of the bleaching processing (in this embodiment, ultraviolet irradiation energy per unit area) is superimposed on the dopant concentration distribution shown in FIG. 5. In the graph, the solid line indicates the dopant concentration distribution, and the broken line indicates the intensity distribution of the bleaching processing.

As shown in the graph, the intensity distribution of the bleaching processing does not necessarily change continuously, but may change stepwise. In the example shown in the graph, the intensity of the bleaching processing is changed in three steps, and the bleaching intensity is the highest in a region a in the peripheral portion of the electroluminescence display device 100 where the dopant concentration is the highest. In a region b on the inner side of the region a where the dopant concentration is slightly higher, the bleaching intensity is set to an intermediate value, and in a region c in the central portion where the dopant concentration is slightly lower, the bleaching intensity is weak. Of course, this bleaching intensity profile is only an example, and the bleaching intensity may be two steps or four or more steps. Alternatively, the intensity distribution of the bleaching processing may be continuously changed.

Various methods for changing the intensity of the bleaching processing in the plane of the electroluminescence display device 100 are assumed and are not particularly limited. For example, a method of controlling the amount of transmitted ultraviolet light at the time of the bleaching processing by using a halftone mask may be considered. Referring to FIG. 6, in the region a in the graph, the aperture ratio of the halftone mask is increased (for example, 90%), and in the region b, the aperture ratio of the mask is set to an intermediate value (for example, 70%), and in the region c, the aperture ratio of the mask is set to a low value (for example, 50%). Thus, the bleaching intensity profile shown in the drawing can be easily obtained. Depending on the design of the aperture ratio of the halftone mask, it is possible to determine how many steps the intensity of the bleaching processing is to be changed or continuously.

Figure 7:
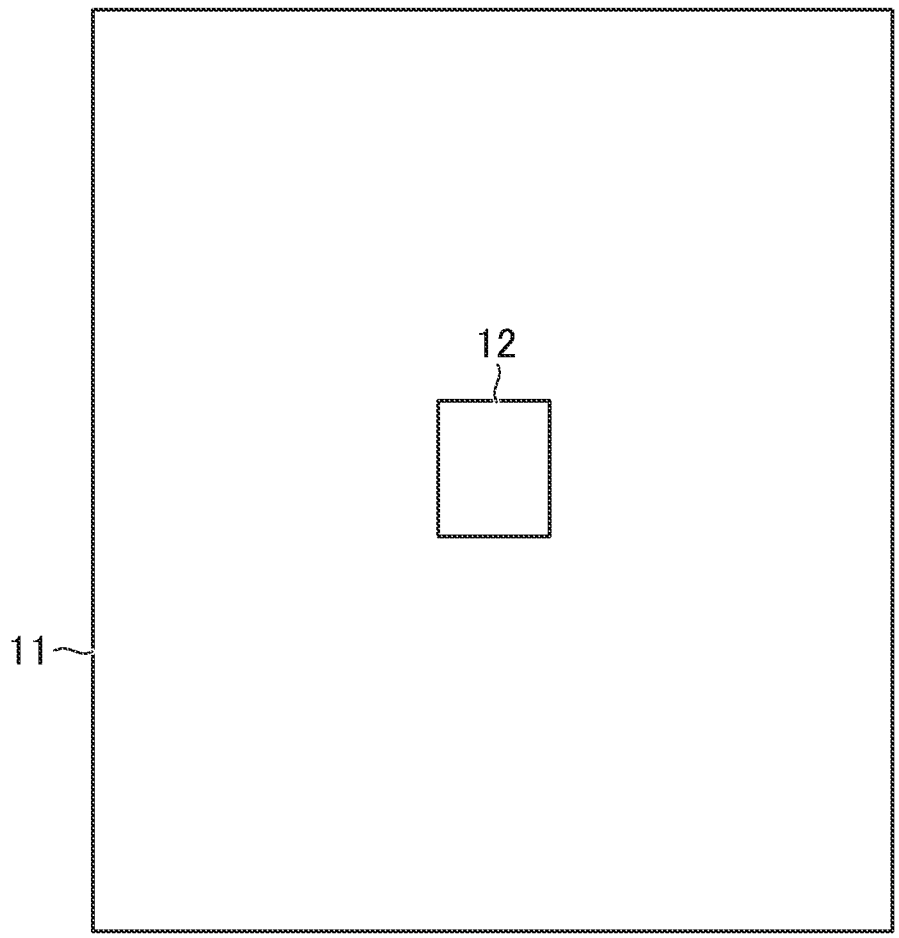
FIG. 7 is a diagram illustrating the bleaching processing using a partially opened mask.
Figure 7:
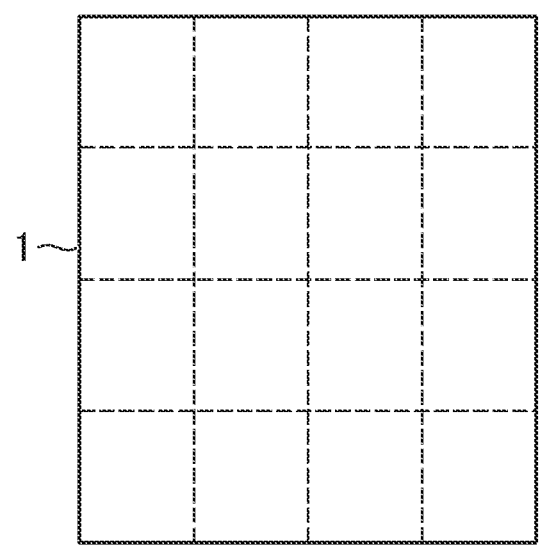

Alternatively, an arbitrary profile can be obtained by moving the partially opened mask in the plane of the electroluminescence display device 100 and changing the bleaching intensity for each region. FIG. 7 is a diagram illustrating such a process. Reference numeral 11 denotes a planar shape of a rectangular mask used at the time of the bleaching processing, and a rectangular opening 12 is also provided at substantially the central portion thereof. Below that, the planar shape of the substrate 1 of the electroluminescence display device 100 is shown. As indicated by broken lines, the substrate 1 is divided into 16 regions of 4 in the vertical direction and 4 in the horizontal direction, and the size and shape of each section are substantially equal to the opening 12 of the mask 11.

In order to perform the bleaching processing on the substrate 1 using the mask 11, first, the opening 12 of the mask 11 is aligned with an arbitrary region (for example, the upper left region) of the substrate 1, and ultraviolet irradiation is performed for a predetermined time. Subsequently, the position of the opening 12 of the mask 11 is aligned with the next region (for example, one region next from the upper left to the right) separated by a dotted line, and ultraviolet irradiation is performed again for a predetermined time. By changing the time of the ultraviolet irradiation for each region of the substrate 1, the bleaching processing with a desired intensity profile can be performed on the substrate 1.

Alternatively, the same mask 11 as shown in FIG. 7 may be used, and ultraviolet irradiation may be performed so as to scan the entire surface of the substrate 1 while moving the mask 11. At this time, the bleaching processing which becomes a desired intensity profile is achieved by changing the moving speed of the mask 11 arbitrarily.

If the intensity of the bleaching processing for the bank 4 is different, the shape of the bank 4 itself may be affected according to the intensity of the bleaching processing. By measuring the shape of such the bank 4, it is possible to estimate a change in the intensity of the bleaching processing that has been performed on the bank 4.

Figure 8A:
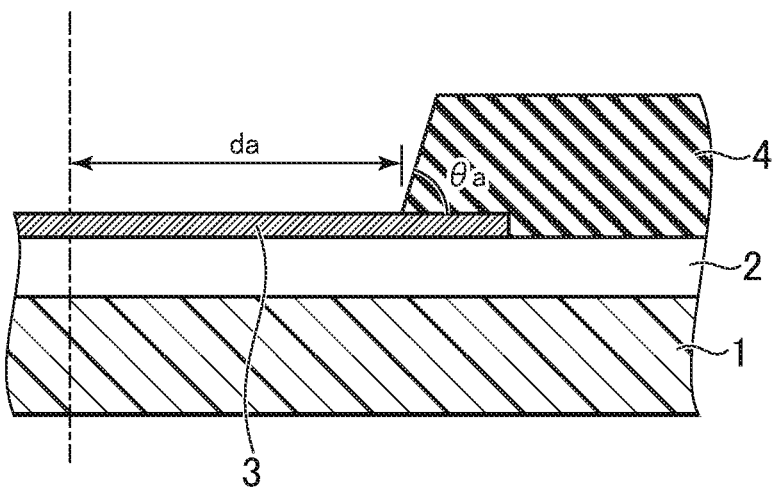
FIGS. 8A to 8C are diagrams illustrating changes in the cross-sectional shape of the bank depending on the intensity of the bleaching processing.
Figure 8B:
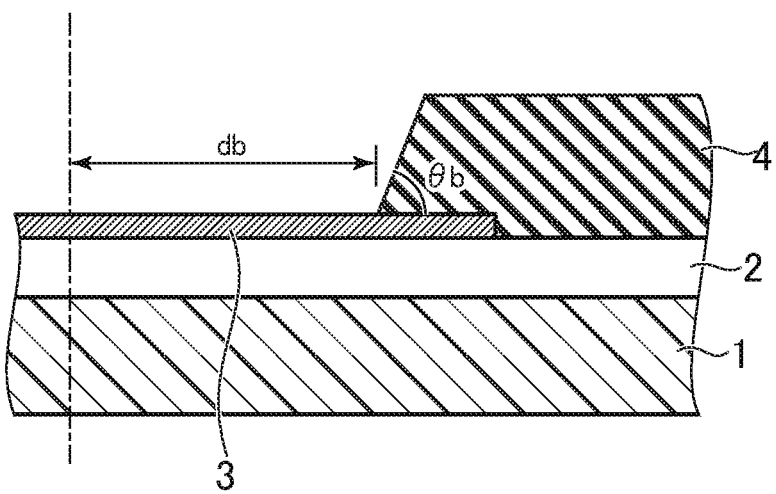
Figure 8C:
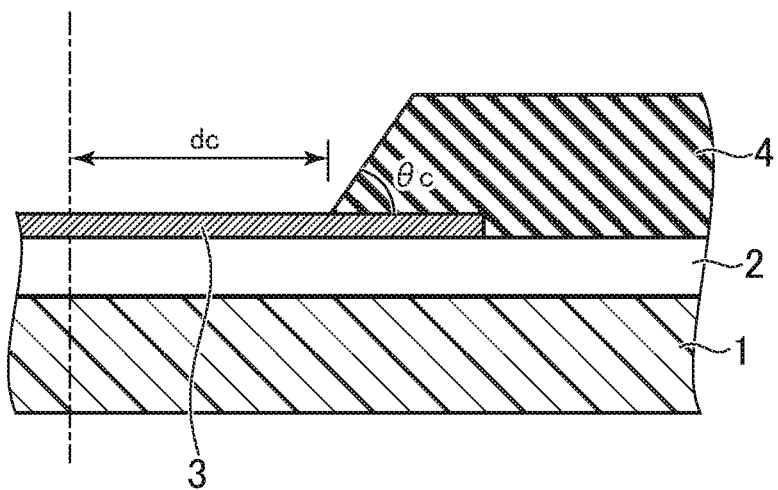

FIGS. 8A to 8C are diagrams illustrating changes in the cross-sectional shape of the bank 4 due to the bleaching processing intensity. FIG. 8A shows a case where the relative intensity of the bleaching processing is high, FIG. 8B shows a case where the relative intensity of the bleaching processing is intermediate, and FIG. 8C shows a case where the relative intensity of the bleaching processing is low.

Typically, as shown in FIGS. 8A to 8C, as the intensity of the bleaching processing increases, a taper angle θ of the end portion of the bank 4 (the angle of the inclined surface with respect to the surface of the substrate 1) increases, although this depends on the material of the bank 4 and other conditions. That is, assuming θa for the case of FIG. 8A, θb for the case of FIG. 8B, and θc for the case of FIG. 8C, the relationship θa>θb>θc is established, and such a taper angle θ at the end portion of the bank 4 can be measured at a plurality of locations in the plane of the electroluminescence display device 100 to estimate the relative distribution of the bleaching processing intensity.

Alternatively, as shown in FIGS. 8A to 8C, as the intensity of the bleaching processing increases, the end portion of the bank 4 is more retracted and the opening is enlarged. That is, a distance d from the center of each pixel (indicated by the alternate long and short dash line in FIGS. 8A to 8C) to the end portion of the bank 4 increases as the intensity of the bleaching processing increases. That is, assuming da for the case of FIG. 8A, db for the case of FIG. 8B, and dc for the case of FIG. 8C, the relationship da>db>dc is established, and the distance d from the center of each pixel to the end portion of the bank 4 can be measured at a plurality of locations in the plane of the electroluminescence display device 100 to estimate the relative distribution of the bleaching processing intensity.

The extent to which the shape change occurs in the bank 4 due to the bleaching processing differs depending on the type of the bleaching processing and the material of the bank 4, and cannot be generally specified. Therefore, after specifying the material of the bank 4 and the bleaching processing, what side is actually brought to the bank 4 by the bleaching processing is specified experimentally.

Figure 9:
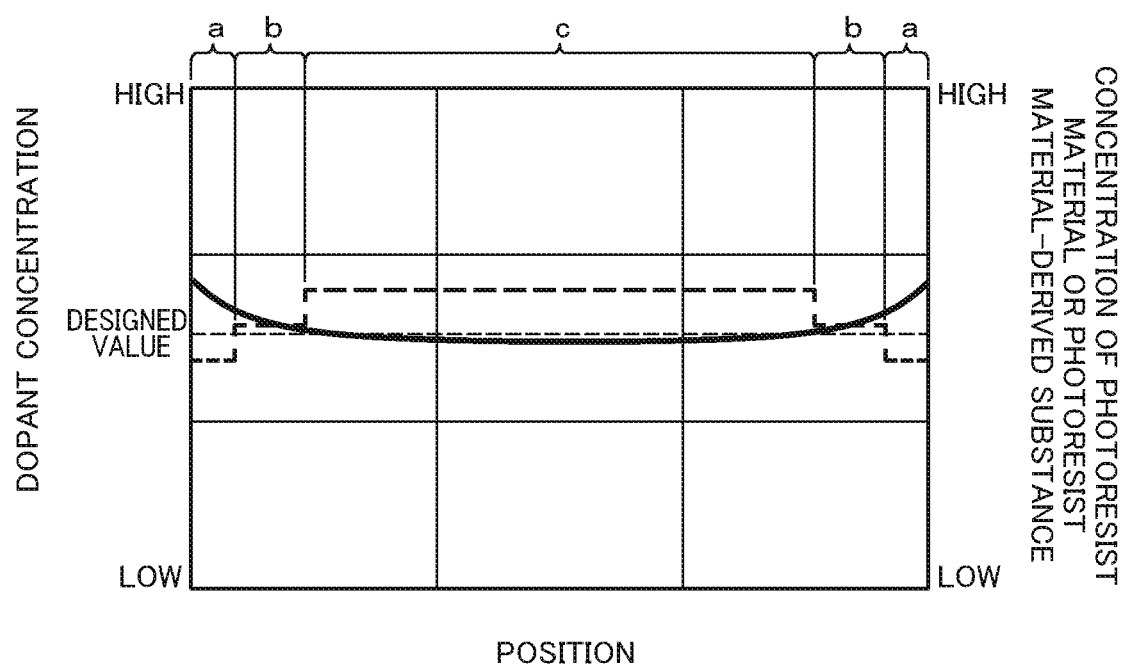
FIG. 9 is an example of a graph showing the concentration of a photoresist material or a photoresist material-derived substance with respect to the dopant concentration.

What is important is the concentration of the photoresist material or the photoresist material-derived substance remaining on the surface of the bank 4 or inside thereof, and the concentration thereof may be directly measured. FIG. 9 is an example of a graph showing the concentration of the photoresist material or the photoresist material-derived substance with respect to the dopant concentration in the electroluminescence display device 100 when the bleaching intensity is changed in the plane.

As shown by the broken line in the drawing, as the region has a higher dopant concentration (a in the drawing), the concentration of the photoresist material or the photoresist material-derived substance is lower, and as the region has a lower dopant concentration (c in the drawing), the concentration of the photoresist material or the photoresist material-derived substance is higher. In the region where the dopant concentration is intermediate (b in the drawing), the concentration of the photoresist material or the photoresist material-derived substance also shows an intermediate value. That is, the concentration distribution of the dopant in the plane of the electroluminescence display device 100 and the concentration distribution of the photoresist material or the photoresist material-derived substance remaining inside or on the surface of the bank 4 have a negative correlation.

The concentration of the photoresist material or the photoresist material-derived substance remaining inside or on the surface of the bank 4 may be directly measured by measuring each measurement point on the sample of the electroluminescence display device 100 formed up to the bank 4 using a known technique such as EDX, SIMS, or GCMS, and may be calculated by converting the concentration from the obtained element distribution, in the same manner as the concentration of the dopant. In general, since the photoresist material or the photoresist material-derived substance is an organic compound, the concentration of the photoresist material or the photoresist material-derived substance can be estimated by paying attention to the carbon concentration, for example. Since the measurement availability and measurement accuracy depend on the material of the bank 4 and the photoresist material to be used, it is not possible to generally specify the measurement and conversion techniques, and the measurement and conversion techniques are set according to the conditions.

The present invention is not limited to the above embodiment, and various modifications can be made. For example, the configuration can be replaced with a configuration that is substantially the same as the configuration shown in the above embodiment, a configuration that exhibits the same operational effects, or a configuration that can achieve the same purpose.

In the scope of the idea of the present invention, those skilled in the art can conceive various changes and modifications, and it is understood that these changes and modifications also belong to the scope of the present invention. For example, those in which addition, deletion, or change in design of components is appropriately performed by the person skilled, or addition, omission or change in conditions of processes is performed for each of the above-described embodiments are included in the scope of the present invention as long as the gist of the present invention is provided.

While there have been described what are at present considered to be certain embodiments of the invention, it will be understood that various modifications may be made thereto, and it is intended that the appended claims cover all such modifications as fall within the true spirit and scope of the invention.

What is claimed is:

1. An electroluminescence display device, comprising:
    a plurality of pixels that include, on a substrate, a light emitting layer made of an electroluminescent material in which a dopant is added to a host material; and
    a bank that separates adjacent pixels, wherein
    within a plane of the substrate, a concentration of the dopant in the light emitting layer is distributed, and a concentration of a photoresist material or a photoresist material-derived substance remaining inside the bank is distributed, wherein
    the concentration distribution of the dopant has a correlation with the concentration distribution of the photoresist material or the photoresist material-derived substance remaining inside or on the surface of the bank.

2. The electroluminescence display device according to claim 1, wherein
    the correlation between the concentration distribution of the dopant and the concentration distribution of the photoresist material or the photoresist material-derived substance remaining inside the bank is a negative correlation.

3. A manufacturing method of an electroluminescence display device, the manufacturing method comprising:
    forming a bank separating pixels on a substrate by photolithography,
    forming a light emitting layer made of an electroluminescent material in which a dopant is added to a host material on the substrate by vapor deposition, and
    non-uniformly bleaching the bank inside a plane according to an in-plane distribution of a dopant concentration of the light emitting layer or the in-plane distribution of deterioration over time of the light emitting layer.

4. The manufacturing method of an electroluminescence display device according to claim 3, comprising:
    measuring the in-plane distribution of the dopant concentration of the light emitting layer or the in-plane distribution of deterioration over time of the light emitting layer.

* * * * *